United States Patent
Niimi et al.

(10) Patent No.: US 9,202,659 B2
(45) Date of Patent: Dec. 1, 2015

(54) ARRANGEMENT AND METHOD FOR COOLING A PLASMA-BASED RADIATION SOURCE

(71) Applicant: USHIO Denki Kabushiki Kaisha, Tokyo-to (JP)

(72) Inventors: Gota Niimi, Shizuoka-ken (JP); Dominik Marcel Vaudrevange, Aachen (DE); Ralf Gordon Conrads, Kempen (DE); Maghiel Jan Kole, San Jose, CA (US); Wilhelmus V. J. Van Nunspeet, Simpelveld (NL); Johannes W. J. L. Cuijpers, Roermond (NL); Andre Matthias Prinz, Dueren (DE)

(73) Assignee: USHIO Denki Kabushiki Kaisha, Tokyo-to (JP)

( * ) Notice: Subject to any disclaimer, the term of this patent is extended or adjusted under 35 U.S.C. 154(b) by 0 days.

(21) Appl. No.: 14/517,999

(22) Filed: Oct. 20, 2014

(65) Prior Publication Data

US 2015/0108365 A1    Apr. 23, 2015

(30) Foreign Application Priority Data

Oct. 18, 2013   (DE) .......................... 10 2013 017 655

(51) Int. Cl.
*H01J 37/24* (2006.01)
*H01J 7/24* (2006.01)
(Continued)

(52) U.S. Cl.
CPC .............. *H01J 7/24* (2013.01); *H01J 37/32798* (2013.01); *H05G 2/005* (2013.01); *H05G 2/008* (2013.01); *H01J 37/32522* (2013.01); *H01J 2237/002* (2013.01)

(58) Field of Classification Search
USPC .......................................................... 250/429
See application file for complete search history.

(56) References Cited

U.S. PATENT DOCUMENTS 7,501,642 B2 * 3/2009 Moors et al. ........ G03F 7/70033
250/492.1

(Continued)

FOREIGN PATENT DOCUMENTS

DE           10342239 A1    6/2005
DE      102005023060 A1   11/2006

(Continued)

OTHER PUBLICATIONS

Kim, Jungho, Spray cooling heat transfer: The state of the art, International Journal of Heat and Fluid Flow, 2007, pp. 753-767, vol. 28.

(Continued)

*Primary Examiner* — Phillip A Johnston
(74) *Attorney, Agent, or Firm* — Patentbar International, P.C.

(57) ABSTRACT

An arrangements and methods for cooling a plasma-based radiation source having a revolving element which is to be cooled, particularly for application in EUV radiation sources, is disclosed. The revolving element is immersed in the metal coolant in a first vessel of a primary cooling circuit, and a secondary cooling circuit with a cooling liquid evaporating at the desired operating temperature of the metal coolant has a control unit for controlling at least one atomizing arrangement in a differentiated manner and for selectively controlling a heater in case the determined temperature falls below a minimum operating temperature of the metal coolant. The at least one atomizing arrangement in a cooling section selectively sprays individual wall regions of the first vessel with the cooling liquid depending on the determined temperature of the metal coolant.

16 Claims, 4 Drawing Sheets

(51) Int. Cl.
*H01J 37/32* (2006.01)
*H05G 2/00* (2006.01)

(56) References Cited

U.S. PATENT DOCUMENTS

| | | | | |
|---|---|---|---|---|
| 7,622,727 | B2* | 11/2009 | Shirai | B82Y 10/00 250/423 R |
| 7,630,475 | B2* | 12/2009 | Neff | G03F 7/70033 250/504 R |
| 8,610,089 | B2* | 12/2013 | Donders et al. | F28D 15/0266 250/492.1 |
| 9,018,604 | B2* | 4/2015 | Niimi | H05G 2/008 250/493.1 |
| 2014/0312761 | A1* | 10/2014 | Tamagaki | C23C 14/3407 313/34 |

FOREIGN PATENT DOCUMENTS

| | | |
|---|---|---|
| DE | 102007060807 B4 | 11/2009 |
| DE | 102013103668 A1 | 10/2014 |
| EP | 0729560 B1 | 7/1998 |
| EP | 1804556 A2 | 7/2007 |

OTHER PUBLICATIONS

Yan, Z. B. et al, Large area spray cooling by inclined nozzles for electronic board, 12th Electronics Packaging Technology Conference 2010.

* cited by examiner

# ARRANGEMENT AND METHOD FOR COOLING A PLASMA-BASED RADIATION SOURCE

RELATED APPLICATIONS

This application claims priority to German Patent Application No. DE 10 2013 017 655.7, filed Oct. 18, 2013, which is incorporated herein by reference in its entirety.

FIELD OF THE INVENTION

The invention is directed to an arrangement and a method for cooling a plasma-based radiation source having a revolving element which is to be cooled and which takes part in the plasma generation, and with a primary cooling circuit having a vessel which contains a metal coolant and in which the revolving element is at least partially immersed, means for circulating the metal coolant in the vessel, and a heater for correcting the temperature of the metal coolant to an operating temperature above the melting temperature thereof, particularly for application in EUV radiation sources for semiconductor lithography.

BACKGROUND OF THE INVENTION

Extreme ultraviolet (EUV) radiation with wavelengths of $\lambda < 50$ nm which is needed, particularly at wavelengths $\lambda \leq 13.5$ nm, for photolithography fabrication of next-generation integrated circuits can be generated by plasma-based radiation sources. The EUV radiation can be generated through excitation of a suitable source material whose plasma has emission lines in the EUV spectrum. For plasma generation, the source material must be excited inside a radiation source, the generated EUV radiation then being coupled out of the latter. The two primarily accepted methods for plasma generation in the wavelength range around 13.5 nm are excitation by means of high-energy radiation, e.g., by means of a laser beam (Laser-Produced Plasma—LPP) or by means of a gas discharge (Discharge-Produced Plasma—DPP) and hybrid forms thereof, among which Laser-assisted Discharge Plasma (LDA) has become most prevalent. Plasma generation is an energy-intensive process in which an efficiency of about 0.1% is achieved. The majority of the energy that is used is lost in the form of waste heat. In order to dissipate the very large amounts of waste heat, a radiation source of this kind requires an efficient cooling system. High cooling efficiency can be achieved through the use of a metal coolant. This metal coolant has a high heat capacity coupled with high heat conductivity so that large amounts of heat can be dissipated quickly.

In radiation sources in which plasma formation takes place by means of gas discharge, two electrodes are located opposite one another and a strong electric field is produced locally therebetween. The source material is introduced into the electric field in a form which leads to the gas discharge.

A radiation source of this type is disclosed in EP 1 804 556 A2, wherein the two electrodes are arranged as circular disk electrodes in a plane so as to be rotatable around their orthogonal axes of rotation such that they have at a point on their outer circumference an electrode gap with minimal distance relative to one another. The gas discharge takes place in this electrode gap.

The source material takes the form—separately for each disk electrode—of a melt bath with suitable metal into which the disk electrode is dipped by a portion of its circumference. In order to keep the metal in liquid state, it is heated in the radiation source to at least above its melting point. As the disk electrode rotates through the melt bath, a thin layer of metal forms at the circumference and is conveyed into the electrode gap by the rotating disk electrode.

In the electrode gap, a laser beam by which the source material is initially evaporated is directed to one of the disk electrodes. Accordingly, evaporated, partially ionized source material is present in the electrode gap and is converted into completely ionized, hot plasma by a subsequent gas discharge (LDP). The plasma developing in this way emits the desired EUV radiation.

During continuous operation of the radiation source, the disk electrodes are highly heated. For cooling the disk electrodes, EP 1 804 556 A2 discloses also using the source material as metal coolant. In so doing, the waste heat is passed to the melt bath coming in contact with the rotating disk electrode, and the metal coolant is additionally set in motion through the rotation of the disk electrode so that a continual exchange of the liquid metal coming in direct contact with the disk electrodes takes place in the entire volume of the melt bath. Steps are described for enhancing the circulation of the liquid metal by arranging radial ribs or holes at the disk electrodes. However, no details are given as to how to correct the temperature of the liquid metal bath in a suitable manner to ensure trouble-free functioning during continuous operation as well as during process-related interruptions in radiation.

A possibility for cooling the liquid metal that is used as source material and as coolant simultaneously is disclosed in the not-prior-published DE 10 2013 103 668 which, in addition to the melt bath for the disk electrode, describes a handling device for the liquid metal for producing a cooling circuit. A compact source module with disk electrode and melt bath is connected in a circuit with the handling device via feed/return conduits and provides for a pump-assisted circulation. Owing to the compact construction of the source module, the handling device has a reservoir in which the greatest proportion of the liquid metal present in the circuit is located. The temperature of the liquid metal can be corrected to an optimal temperature just above its melting point in the handling device. To this end, an additional cooling device is also connected to the handling device in order to keep the liquid metal that is pumped from the reservoir back to the source module in the circuit at a suitable temperature through active cooling of a return pipe. Spray cooling is suggested by way of example.

Many scientific articles have already been published on the subject of applying spray cooling. An overview is given by Jungho Kim in the article: "Spray cooling heat transfer: The state of the art" (*International Journal of Heat and Fluid Flow* 28/2007). Using applications in high-power electronics as an example, the article describes mechanisms and influencing factors of spray cooling which were studied for laminar cooling of small surfaces in the range of a few square centimeters. Further, another survey article is known in which, inter alia, the cooling performance of nozzle arrays was investigated (Yan, Z. B. et al., "Large area spray cooling by inclined nozzles for electronic board"—12th Electronics Packaging Technology Conference 2010).

Common to all of the publications is that, apart from maximizing cooling performance, no measures are described for a load-dependent operation of cooling nozzles of a spray cooling arrangement under sharply fluctuating heat input.

SUMMARY OF THE INVENTION

It is the object of the invention to find a novel possibility for cooling a plasma-based radiation source using a metal coolant in which the temperature of the metal coolant can be maintained virtually constant for a sharply varying heat input stretching from standby operation to continuous operation of the radiation source.

In an arrangement for cooling a plasma-based radiation source having a revolving element which is to be cooled and which takes part in a plasma generation, and with a primary cooling circuit having a first vessel which contains a metal coolant and in which the revolving element is at least partially immersed, means for circulating the metal coolant in the first vessel, and means for correcting the temperature of the metal coolant to a desired operating temperature above the melting point of the metal coolant, the above-stated object is met according to the invention in that a secondary cooling circuit has a cooling liquid which is a liquid that evaporates at the operating temperature of the metal coolant, at least a second vessel which encloses at least one cooling section of the first vessel, at least one atomizing arrangement for the cooling liquid which is arranged in such a way that a defined wall region of the at least one cooling section of the first vessel can be sprayed with the cooling liquid depending on a temperature determined for the metal coolant, a cooling unit for the cooling liquid which is provided for sucking evaporated cooling liquid out of the at least one second vessel, for condensing and for returning the cooling liquid under pressure to the at least one atomizing arrangement, and has a control unit for controlling the means for correcting the temperature of the metal coolant, which control unit is configured for differentiated cooling through control of the at least one atomizing arrangement depending on the determined temperature of the metal coolant and for selectively heating through control of a heater in case the determined temperature falls below a minimum operating temperature of the metal coolant.

The atomizing arrangement advantageously has a plurality of cooling nozzles which are directed in each instance to a defined wall region of the enclosed cooling section of the first vessel and which can be switched on and off individually depending on the determined temperature of the metal coolant, and the control unit is configured to control the cooling nozzles individually depending on the determined temperature of the metal coolant.

Advisably, at least one temperature sensor is provided at a vessel wall of the first vessel at which heat introduction by the revolving element via the metal coolant is observed first.

Preferably, a first temperature sensor is arranged downstream of a region of the first vessel in which the revolving element is immersed and a second temperature sensor is arranged upstream of this region so that a temperature difference can be measured for heat injected by the revolving element.

Advantageously, in another variant a first temperature sensor is arranged upstream of the at least one cooling section of the first vessel that is sprayed by the at least one atomizing arrangement and a second temperature sensor is arranged downstream of this at least one cooling section so that a temperature difference can be measured for heat removal via the at least one cooling section.

It has proven advisable that the at least one wall region of the at least one cooling section is arranged upstream of a supply of the metal coolant to the revolving element in the primary cooling circuit through which the metal coolant flows.

Preferably, the wall regions of the at least two separated cooling sections of the first vessel are enclosed either by the second vessel or by a third vessel, and each of these at least two cooling sections has in each instance an atomizing arrangement for the cooling liquid, one of the cooling sections being arranged upstream of a supply of the metal coolant to the revolving element in the primary cooling circuit through which the metal coolant flows and another of the cooling sections being arranged downstream of a removal of the metal coolant from the revolving element in the primary cooling circuit.

Preferably, there is associated with each cooling section at the primary cooling circuit a temperature sensor for determining the temperature upstream of the respective cooling section and a temperature sensor for determining the temperature downstream of the respective cooling section.

In another construction, one cooling section at the primary cooling circuit in the one wall region of the first vessel is arranged upstream of the supply of the metal coolant to the revolving element and a further cooling section at the primary cooling circuit in a further wall region of the first vessel is arranged downstream of a removal of the metal coolant from the revolving element.

Advisably, the one cooling section at the one wall region of the first vessel is arranged in the region of a reservoir of the metal coolant and the further cooling section at a further wall region of the first vessel is arranged in the region of the immersed revolving element.

Alternatively, the one cooling section at the one wall region of the first vessel is arranged at the supply channel to a region in which the revolving element is immersed in the metal coolant, and the further cooling section at a further wall region of the first vessel is arranged at a reservoir of the metal coolant downstream of a return channel from the region of the immersed revolving element.

Further, in a method for cooling a plasma-based radiation source in which a revolving element which is to be cooled and which takes part in a plasma generation is immersed in a metal coolant received in a first vessel, the above-stated object is met through the following steps:

heating the metal coolant to an operating temperature above its melting point, circulating the metal coolant and forming a primary cooling circuit for supplying constantly cooled, fresh metal coolant to the revolving element to be cooled, and cooling the primary cooling circuit with a cooling liquid in a secondary cooling circuit by means of a spray cooling in which a cooling output is controlled as a function of the determined temperature of the metal coolant.

Another embodiment of the method can have the following advantageous steps:

determining the temperature of the metal coolant upstream and downstream of the revolving element and calculating a temperature difference for a heat injection caused by the revolving element, controlling the cooling output of the spray cooling depending on the calculated temperature difference for the heat injection, and cooling the metal coolant in an adjusted manner by selectively switching on and switching off a plurality of cooling nozzles which respectively spray the cooling liquid on different wall regions of a cooling section of a first vessel containing the metal coolant.

Further, a modified method advisably has the following steps:

determining the temperature of the metal coolant upstream and downstream of a cooling section of a first vessel of the primary cooling circuit and calculating a temperature difference for a heat removal achieved via the cooling section, controlling the cooling output of the spray cooling as a function of the calculated temperature difference for the achieved heat removal, and cooling the metal coolant in an adjusted manner by selectively switching on and switching off a plurality of cooling nozzles which respectively spray the cooling liquid on different wall regions of a cooling section of a first vessel containing the metal coolant.

Finally, the method can alternatively also comprise the following steps:

cooling the metal coolant in an adjusted manner by selectively switching on and switching off a plurality of cooling nozzles in at least two different cooling sections which are operated in regions with different temperature fluctuations of the metal coolant, determining the respective temperature difference for the achieved heat removal via the respective cooling section of the first vessel, and controlling the adjusted cooling in the respective cooling sections as a function of the respective calculated temperature difference for the achieved heat removal.

The invention is based on the fundamental consideration that efficient cooling of an element of a plasma-based radiation source that is directly involved in the plasma generation, particularly in operating phases in which there are a number of pauses or extended pauses between pulses, requires a different cooling regime than that used in quasi-continuous operating phases in which long pulse sequences (bursts) cause very high heat injections. The solution afforded by the invention is based on the aspect that a sharply varying injection of heat into the revolving element cannot be compensated by only a first cooling circuit (even a metal cooling circuit). For this reason, a second cooling circuit with a particularly high cooling efficiency (spray cooling) is selected according to the invention, but must be controllable because of the risk of solidification of the metal coolant in the first cooling circuit. The controllability is achieved through selective spraying of different wall regions of the vessel in which the metal coolant is located. The preferred embodiment is achieved through the use of nozzles that can be switched on and off individually so that the amount of cooling liquid that is sprayed and the sprayed surface of the cooling section of the vessel containing the metal coolant can be controlled. A heater which constantly keeps the metal coolant at a minimum operating temperature moderately higher than the melting temperature of the coolant (e.g., 10 to 50 K above the melting point) is provided in addition for extended downtimes in order to prevent solidification of the metal coolant.

The present invention makes it possible to realize a cooling of a plasma-based radiation source using a metal coolant in which the temperature of the metal coolant can be kept virtually constant for a sharply varying heat injection stretching from standby operating to continuous operation.

BRIEF DESCRIPTION OF THE DRAWINGS

The invention will be described more fully in the following with reference to embodiment examples. The accompanying drawings show.

DETAILED DESCRIPTION OF THE PREFERRED EMBODIMENTS

Figure 1:
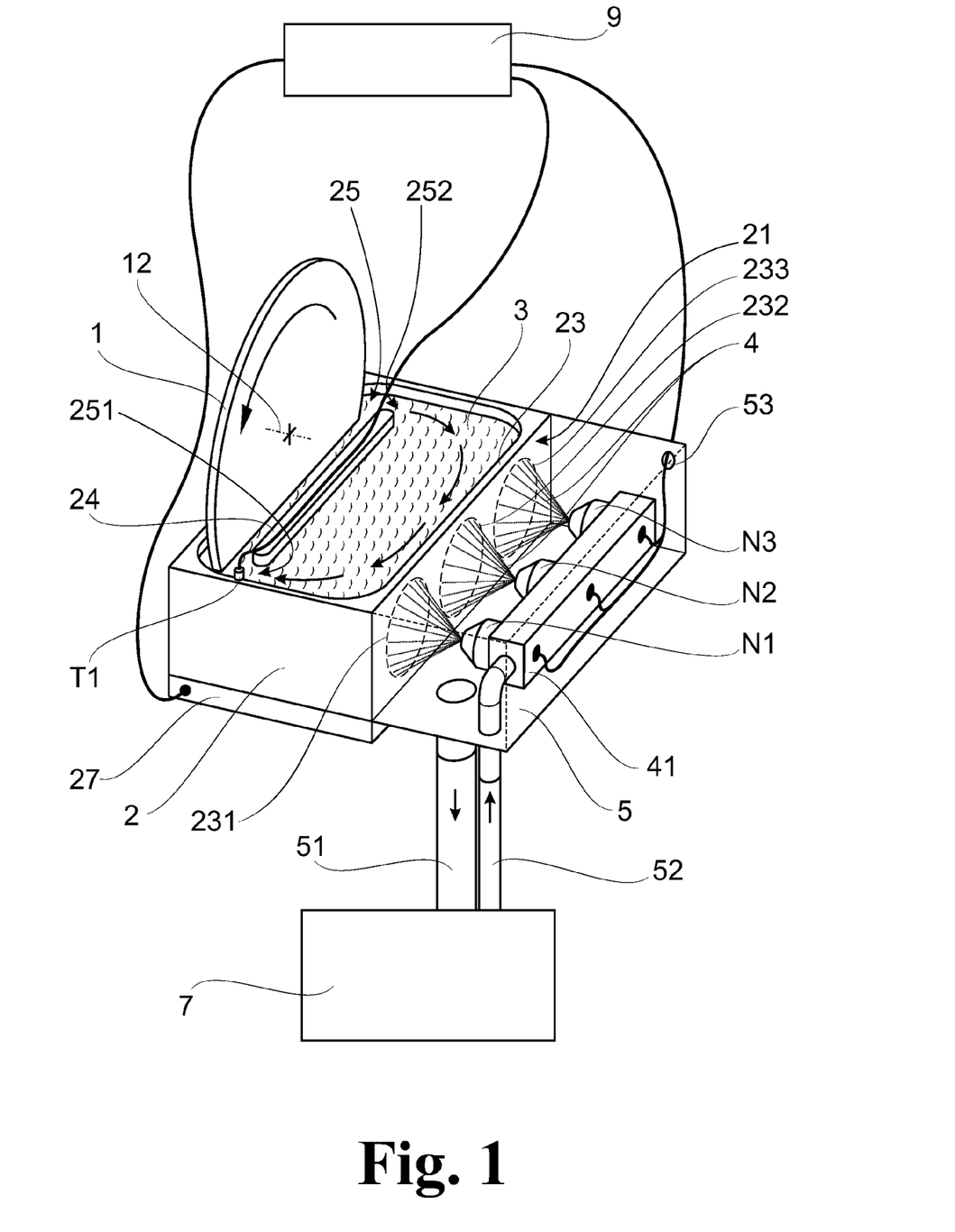
FIG. 1 a general layout of an arrangement for cooling a plasma-based radiation source in which a revolving element to be cooled is partially immersed in a metal melt and the metal melt is circulated in a first vessel with at least one cooling section for spray cooling.

As is shown schematically in FIG. 1, a basic variant of the invention includes a revolving element 1 which is to be cooled and which takes part in a plasma generation in a plasma-based radiation source (not shown), and a first vessel 2 with a metal coolant 3 in which the revolving element 1 is partially immersed. As a result of the revolving motion of revolving element 1, the latter is coated with the metal coolant 3 and waste heat absorbed during plasma generation is simultaneously transmitted into the metal coolant 3 on the one hand and a circulating motion is generated within the first vessel 2 on the other hand. In order to maintain the temperature of the metal coolant 3 substantially constant during the plasma generation taking place at revolving element 1 and to ensure a sufficient cooling of the revolving element 1, at least one cooling section 21 is provided on the outer side of the first vessel 2. At a long vessel wall 23, along the inner side of which the metal coolant 3 flows owing to the circulation thereof, the at least one cooling section unit 21 is so adapted that an atomizing arrangement 41 with a plurality of cooling nozzles N1, N2, . . . in a secondary cooling circuit sprays a wall region 231, 232, . . . , respectively, with a cooling liquid 4. The cooling liquid 4 is so selected that it evaporates at an elevated working temperature of the metal coolant 3 and a particularly efficient cooling is accordingly achieved.

In order to adjust a cooling output in the at least one cooling section 21, a control unit 9 is provided for controlling the secondary cooling circuit, which control unit 9 controls the quantity of cooling nozzles N1, N2, . . . required for the adjusted cooling output based on at least one temperature measurement.

For the cooling liquid 4, a second vessel 5 is arranged such that it encloses the cooling section 21 at the first vessel 2, and the atomizing arrangement 41 is held with cooling nozzles N1, N2, . . . directed to the vessel wall 23. The second vessel 5 is under atmospheric pressure and, for this reason, has an air entry 53 on the outer side. Suction is exerted on the second vessel 5 by means of a cooling unit 7 so that the cooling liquid 4 which is atomized by the cooling nozzles N1, N2, . . . and evaporated on the vessel wall 23 is cooled by condensation. The cooling unit 7 performs the condensation function as well as a pumping function for building up pressure for the cooling nozzles N1, N2, . . . in order to control the secondary cooling circuit for the cooling liquid 4 according to requirements.

As is shown in FIG. 1, the revolving element 1 is mounted so as to rotate around an axis of rotation 12. The revolving element 1 takes part directly in the plasma generation in the plasma-based radiation source (not shown in more detail), and a radiation-emitting plasma 16 is generated at the surface of the revolving element 1. In this connection, the emitter material 14 (designated by reference numeral only in FIG. 2) for the EUV radiation emission is also often—but without limiting generality—provided on the surface of the revolving element 1 so that the emission (radiation and particles) from the plasma 16 and the energy for exciting the plasma 16 lead to a substantial injection of energy into the revolving element 1.

A suitable material emitting a plasma 16 (shown only in FIG. 2) in a desired wavelength range is used for plasma generation (emitter material 14). For example, this material can be tin, whose plasma 16 emits wavelengths in the extreme ultraviolet (EUV) spectral range around 13.5 nm. The emitter material 14 is converted into the radiation-emitting plasma 16 through a high energy injection. To this end, the emitter material 14 is provided as a metal melt and is applied to the revolving element 1. This melt can be used as the metal coolant 3 at the same time.

A laser beam (LPP—Laser-Produced Plasma) or the laser beam combined with a subsequent electric discharge (LDP—Laser-assisted Discharge Plasma) is used in plasma-based radiation sources for generating the high energy.

In LPP generation, the revolving element 1 is a means for transporting the material which is to be converted into plasma 16, the revolving element 1 being coated by immersion in the metal melt, and is evaporated at a different location by a focused laser beam and converted into the radiation-emitting plasma 16.

For generating LDP, the revolving element 1 is used as an electrode which is arranged opposite a second electrode (not shown) so as to be separated by an electrode gap. A strong electric field is built up in the electrode gap in a pulsed manner for the electric discharge. The emitter material is evaporated by means of the laser 15 to prepare the electric discharge.

Owing to poor efficiency in a LDP radiation source (currently only about 0.1% with respect to the desired spectral band), a very high energy injection is required to generate the plasma 16. Accordingly, the majority of the injected energy results in waste heat that is chiefly absorbed by the components of the LDP radiation source involved in the plasma generation. A very efficient cooling operation is required for removing the waste heat. The metal coolant 3 which has a high heat transfer coefficient and high thermal conductivity is used for this purpose. Apart from the plasma generation, the primary cooling circuit also operates under vacuum conditions to minimize changes in the metal coolant, e.g., through oxidation.

To cool the revolving element 1, the latter is partially immersed in the metal coolant 3. To this end, the metal coolant 3 is received in the first vessel 2 which is open on top. The first vessel 2 has a cuboidal shape with a rectangular footprint, two short vessel walls 23 and two long vessel walls 23. For immersion, the revolving element 1 is introduced into the opening of the first vessel 2 in upright attitude with a substantially horizontally oriented axis of rotation 12. The height of the first vessel 2 or the filling level of the metal coolant 3 in the first vessel 2 is such that the circumference of the revolving element 1 can dip into the metal coolant 3 far enough that the waste heat absorbed by the revolving element 1 can be dissipated in an optimal manner.

In a LDP radiation source, the revolving element 1 when immersed in the metal coolant 3 is coated for plasma generation at the same time in that an EUV emitter material 14 (e.g., tin, lithium, gadolinium or terbium) is used as metal coolant 3. Owing to the rotation of the revolving element 1 (i.e., movement of the edge area through the metal coolant 3), freshly applied emitter material 14 is made available at the periphery of the revolving element 1 for each laser beam pulse for plasma generation. For this purpose, the rotating speed is adapted to the desired pulse frequency of the laser beam. After locally initiated plasma generation, the heated segment rotates further, dips into the metal coolant 3, is cooled by the latter and is coated anew. In so doing, the heated segment passes the absorbed waste heat to the metal coolant 3 so that it is cooled off again after emerging.

A heater 27 is arranged at the rectangular base of the first vessel 2 so that the metal coolant 3 which has solidified in a radiation source that is not in operation can be converted to the liquid state. The metal coolant 3 is heated at least to a minimum operating temperature just above the melting point of the metal coolant 3 by the heater 27. The heater 27 also maintains this minimum operating temperature when the radiation source is already in operation but no plasma generation takes place heating the metal coolant 3. This ensures that the metal coolant 3 cannot solidify between discharges during operation of the radiation source.

Further, in the embodiment according to FIG. 1, the revolving element 1 is arranged in such a way that it is immersed in the metal coolant 3 parallel to one of the long vessel walls 23, and an intermediate wall 24 is arranged in the first vessel 2 opposite the long vessel wall 23 with respect to the revolving element 1. The intermediate wall 24 is fastened to the base of the first vessel 2 and has a gap in each instance in longitudinal direction relative to the short vessel walls 23 so that an immersion bath 25 for the revolving element 1 is formed in a portion of the first vessel 2. An inlet 251 and an outlet 252 are formed by the gaps at both ends of the intermediate wall 24. A circuit of metal coolant 3 is produced between the immersion bath 25 and a remaining portion of the first vessel 2 through the inlet 251 and outlet 252 during rotation of the revolving element 1. When dipping into the immersion bath 25, the revolving element 1 carries the metal coolant 3 along with it through the rotation of the revolving element 1 so that the metal coolant 3 coming in contact with the revolving element 1 is set in motion. This produces a flow so that a primary cooling circuit is formed within the first vessel 2 by the circulation. The metal coolant 3 which is locally heated by the revolving element 1 in the immersion bath 25 and which exits through the outlet 252 can mix with the cooler metal coolant 3 located in the residual portion of the first vessel 2 and can pass on the waste heat. It is then sucked into the immersion bath 25 again behind the intermediate wall 24 through the inlet 251 as a result of the rotation of the revolving element 1 and is accordingly supplied again for the cooling of the revolving element 1 and heated anew.

If plasma generation were to proceed continuously, particularly at a high output of the radiation source, the metal coolant 3 would be increasingly heated due to a sustained injection of heat by the revolving element 1. In this way, the cooling of the revolving element 1 would steadily deteriorate. Therefore, active cooling of the metal coolant 3 is required during continuous operation of the radiation source.

The cooling liquid 4 is used for cooling the metal coolant 3. The boiling point of the cooling liquid 4 is adapted to the metal coolant 3 such that the cooling liquid 4 evaporates when it reaches the minimum operating temperature (preferably approximately 20 to 30 Kelvin above the melting point) of the metal coolant 3. When tin with a melting point of 232° C. is used as metal coolant 3, the minimum operating temperature is preferably around 260° C. However, it can also have a boiling point below the melting point of the metal coolant 3 because, in the event that no heat is introduced through the revolving element 1, the cooling by the atomizing arrangement 41 can simply be switched off to prevent the temperature from dropping below the melting point of the metal coolant 3.

The long vessel wall 23 which faces the rest of the first vessel 2 and where the heat transfer between the metal coolant 3 and the cooling liquid 4 takes place is selected as the cooling section 21 in which cooling is carried out with the atomizing arrangement 41 and cooling liquid 4.

To apply the cooling liquid 4, the atomizing arrangement 41 is directed with its cooling nozzles N1, N2, N3, . . . toward this vessel wall 23. To achieve an efficient heat transfer between the metal coolant 3 and the cooling liquid 4, the cooling liquid 4 is applied by spraying or atomizing. To this end, the atomizing arrangement 41 in this example has three cooling nozzles N1, N2, N3. The cooling nozzles N1, N2, N3 are one-component nozzles by means of which the cooling liquid 4 is atomized without the aid of further components such as air, for example. Each cooling nozzle N1, N2, N3 can be switched on and off individually by means of the control unit 9. The cooling liquid 4 sprayed by each of the three cooling nozzles N1, N2, N3 in the cooling section 21 is directed in each instance to its own defined wall regions 231, 232 and 233 of the vessel wall 23, respectively, which can also overlap. When the cooling liquid 4 is applied, a large portion evaporates and a further portion drips down the vessel wall 23. The cooling section 21 is enclosed by the second vessel 5 to catch the evaporated cooling liquid 4, the dripping cooling liquid 4 and the cooling liquid 4 in the form of unconsumed spray mist.

At its underside in line with the force of gravity, the second vessel 5 has a run-off 51 for the cooling liquid 4. The run-off 51 is connected to cooling unit 7 by which the used cooling liquid 4 is pumped out of the second vessel 5. The second vessel 5 has an air entry 53 in its upper region so as to prevent formation of a vacuum during pumping.

The run-off 51 conducts the cooling liquid 4 into the cooling unit 7 in which the evaporated cooling liquid 4 is condensed again and returned to the atomizing arrangement 41 via a return 52 which is outfitted with pumping means (not shown). An atomizing pressure required for atomizing the cooling liquid 4 in the cooling nozzles N1, N2, N3 is generated in the return 52. The atomizing arrangement 41 together with the second vessel 5, the run-off 51, the cooling unit 7 and the return 52 form the secondary cooling circuit by which the metal coolant 3 is cooled.

Cooling is carried out by the secondary cooling circuit depending on at least one temperature measured in the primary cooling circuit. In the simplest case, for the required temperature measurement needed as input variable of the control unit 9, a temperature sensor T1 is arranged at the vessel wall 23 near the inlet 251 to the immersion bath 25. This ensures that the cooling will begin precisely when the metal coolant 3 supplied to the immersion bath 25 exceeds the predetermined minimum operating temperature so that the operating temperature of the metal coolant 3 can be supplied approximately at minimum operating temperature before reaching the revolving element 1.

By determining the temperature, the control unit 9 can determine the required cooling output (or a heating output) needed for keeping the metal coolant 3 at the minimum operating temperature as far as possible. To influence the operating temperature, the cooling nozzles N1, N2, N3 which are connected to the control unit 9 via control lines can be switched on and off individually. By apportioning the cooling liquid 4 to a plurality of cooling nozzles N1, N2, N3 (three in this case), the cooling performance of the atomizing arrangement 41 can be adapted very precisely to the varying and occasionally rapidly changing heat discharged by the revolving element 1.

Figure 2:
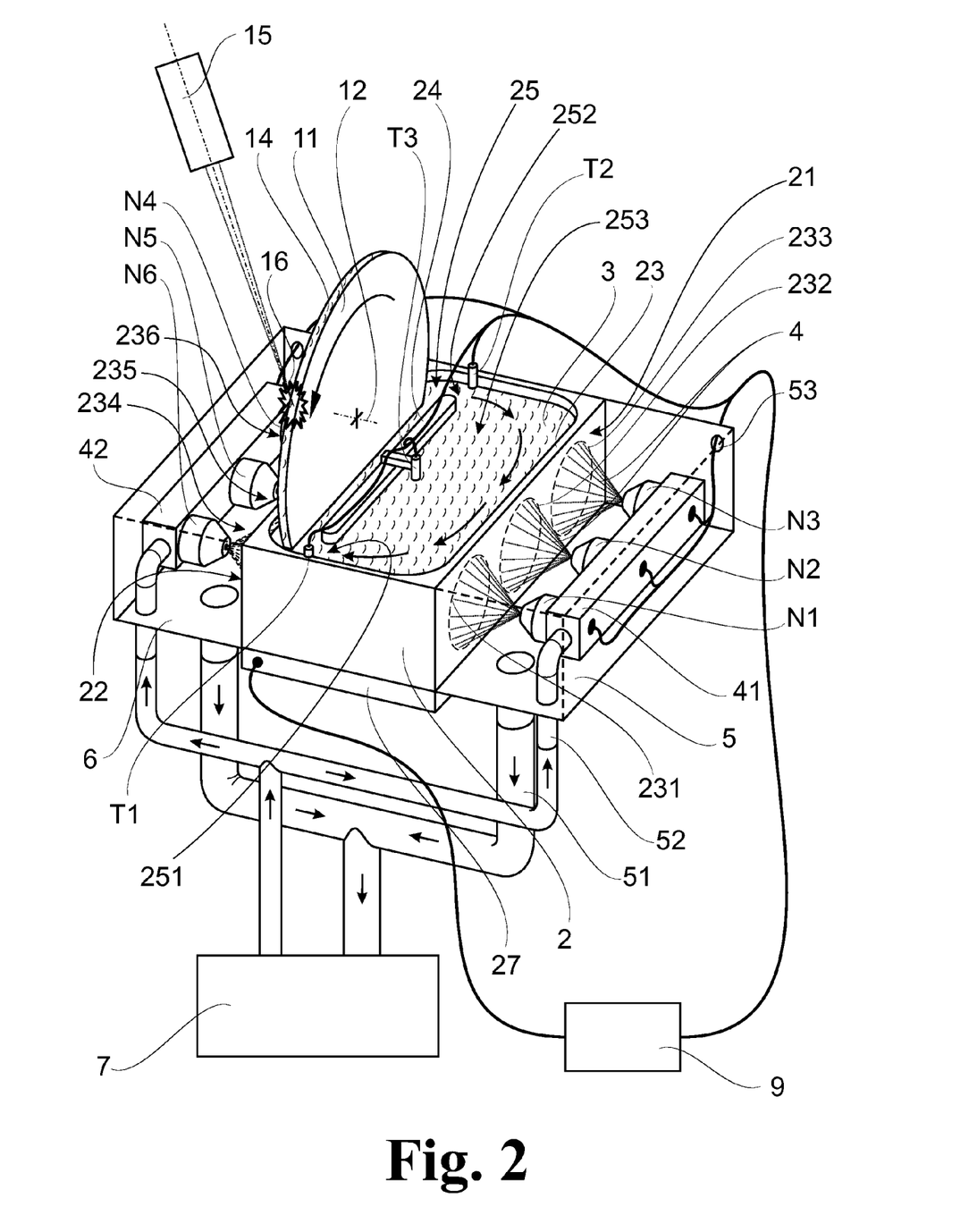
FIG. 2 an embodiment of the arrangement modified from that shown in FIG. 1 with a first vessel and two identical cooling sections of spray cooling which are accommodated respectively in a second vessel and a third vessel and are incorporated in a cooling circuit.

In FIG. 2 which shows a modification of the arrangement shown in FIG. 1, the first vessel 2 has the intermediate wall 24 arranged in the vicinity of, and parallel to, one of the long vessel walls 23. The intermediate wall 24 is again fastened to the base of the first vessel 2 and divides a total volume of the metal coolant 3 received in the first vessel 2 in a ratio of about 1:5 into a small volume, as immersion bath 25 for the revolving element 1, and a large volume 253 as a kind of reservoir for the metal coolant 3. As in FIG. 1, the intermediate wall 24 again forms with the short vessel walls 23 an inlet 251 and an outlet 252 to the immersion bath 25 so that the metal coolant 3 is impelled from the large volume 253 into the immersion bath 25 and from the latter into the large volume 253 again through rotation of the revolving element 1. The revolving element 1 is formed in this case as the circular disk 11 which is rotatable around its axis of rotation 12 and which is immersed in the metal coolant 3 parallel to and centrally between the intermediate wall 24 and the closest long vessel wall 23 of the first vessel 2.

In this example, it is assumed that the disk 11 serves as a feed device for the emitter material 14 of a LPP radiation source. The radiation source itself is not shown in its entirety. For the plasma generation, a laser 15 is focused on the disk 11 coated with the emitter material 14 as is shown schematically in FIG. 2, so that the emitter material 14 is initially evaporated by the pulsed laser 15 and subsequently excited by a further pulse to form radiation-emitting hot plasma 16. Two different lasers (not shown) can also be used for the two precisely triggered laser pulses.

The flow, already described above, leading to the circulation of the metal coolant 3 and to the formation of the primary cooling circuit is formed in the immersion bath 25 as a result of the continuous rotation of the disk 11. In the primary cooling circuit, the metal coolant 3 heated by the disk 11 exits the immersion bath 25 through the outlet 252 serving as a passage to the large volume 253 in the first vessel 2, where the heated metal coolant 3 can mix with the metal coolant 3 cooled in the large volume 253 and can cool off. The cooler metal coolant 3 is guided back again through the inlet 251 in front of the rotating disk 11 from the large volume 253 to the rotating disk 11 for cooling.

In this example, the secondary cooling circuit of the cooling liquid 4 has two atomizing arrangements 41 and 42 with three cooling nozzles N1-N3 and N4-N6, respectively. In addition to the cooling section 21, already described with reference to FIG. 1, which is formed at the vessel wall 23 remote of the immersion bath 25, another cooling section 22 is provided which is formed at the other long vessel wall 23 at the immersion bath 25. In the further cooling section 22, the spray cone of the cooling nozzles N4, N5, N6 is directed to a separate wall region 234, 235 and 236, respectively, of the first vessel 2 in each instance, and the further atomizing arrangement 42 is enclosed by a third vessel 6 in the same way as atomizing arrangement 41 is enclosed by the second vessel 5. Both atomizing arrangements 41 and 42 and the second vessel 5 and third vessel 6 are connected to the same cooling unit 7 via the run-off 51 and the return 52, but can also be associated with separate cooling units (not shown).

The temperature sensor T1 is arranged directly in front of the rotating disk 11 in the primary cooling circuit to determine the temperature for controlling the atomizing arrangements 41 and 42 by means of the control unit 9. The temperature sensor T1 is fastened to the short vessel wall 23 opposite the intermediate wall 24 in the inlet 251 in front of the rotating disk 11. The operating temperature of the metal coolant 3 in front of the disk 11 is detected by this temperature sensor T1. A second temperature sensor T2 is fastened to the other short vessel wall 23 of the first vessel 2 in the outlet 252 downstream of disk 11. This temperature sensor T2 detects the temperature of the metal coolant 3 directly after the injection of heat through the disk 11.

Both temperature sensors T1, T2 are associated with the further cooling section 22. The first temperature sensor T1 monitors the metal coolant 3 for maintaining the minimum operating temperature of the metal coolant 3. Further, the control unit 9 can detect a temperature difference between temperature sensors T1 and T2 and can evaluate an increase in the temperature difference. The control unit 9 determines the required cooling output or—in downtimes between discharges—the heating output of the heater 27 from the temperature measured at first temperature sensor T1 and from the increase in the temperature difference. The cooling nozzles N4-N6 of the further cooling section 22 which can be switched on and off individually are activated by the control unit 9 corresponding to the sensed cooling output.

The mean operating temperature of the metal coolant 3 in the large volume 253 is sensed by a third temperature sensor T3. The third temperature sensor T3 is immersed in the large volume 253 of the first vessel 2 as close as possible to the middle of the large volume 253 and is preferably fastened at the middle of the intermediate wall 24 but is thermally insulated from the latter. Temperature sensor T3 is associated with the first cooling section 21. The individual cooling nozzles N1-N3 of the cooling section 21 or the heater 27 are controlled corresponding to the measured temperature by the control unit 9 in conjunction with at least the measurement of temperature sensor T1.

Figure 3:
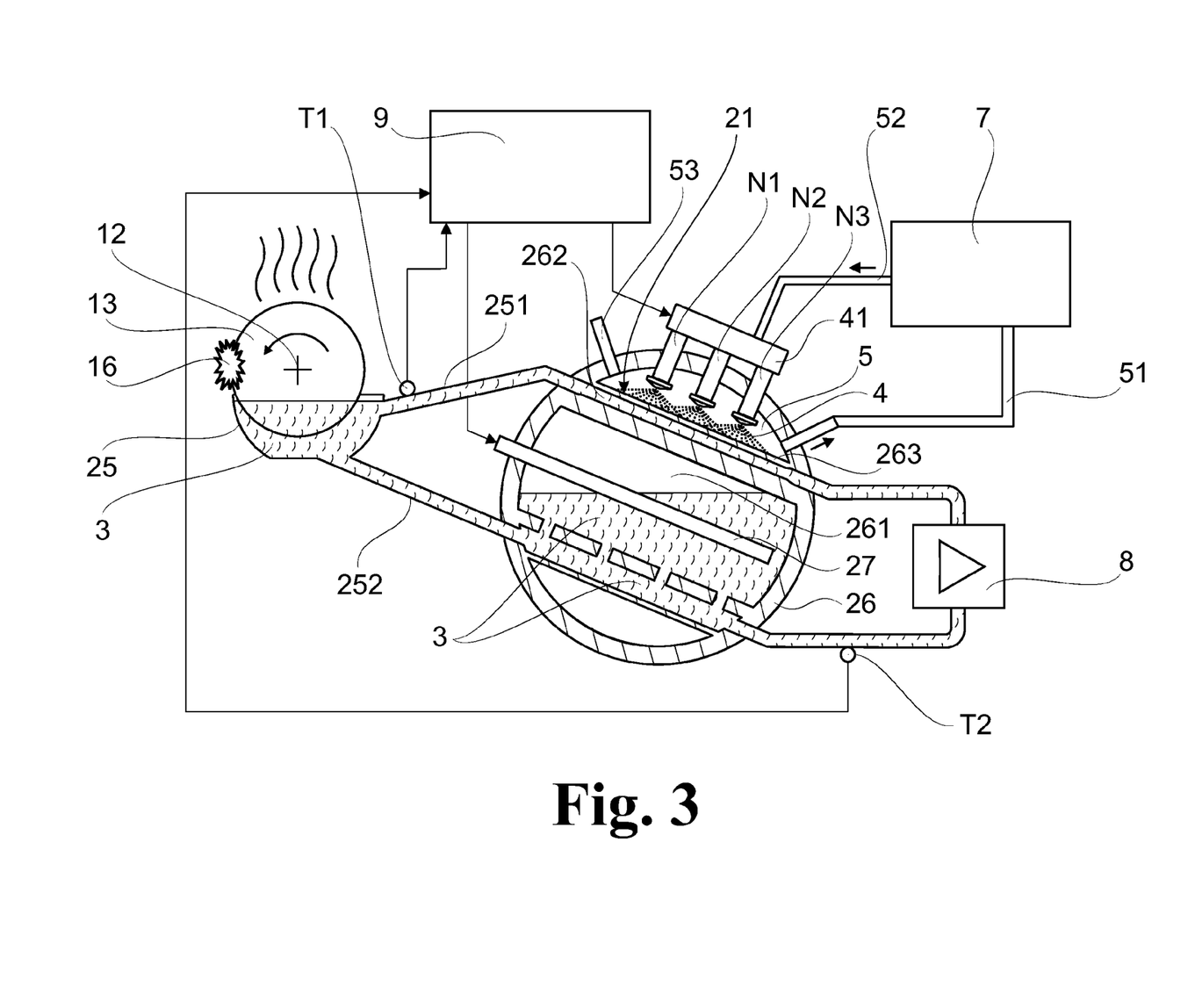
FIG. 3 a further embodiment of the invention having a first vessel which is divided into the melt bath and a handling unit with spray cooling and which is formed as a pumped cooling circuit, wherein the handling unit has a reservoir and a channel-shaped cooling section.

In a further preferred embodiment of the invention, as is shown in FIG. 3, the primary cooling circuit is divided into the immersion bath 25 for the revolving element 1 and a separate handling unit 26 for the metal coolant 3. The inlet 251 and the outlet 252 of the immersion bath 25 are lengthened by pipes. Without limiting generality, the revolving element 1 in this example is formed as a disk electrode 13 for a pure DPP (Discharge-Produced Plasma) radiation source as is known, for example, from patent publication EP 1 804 556 A2. However, the radiation source can also be constructed as a LDP (Laser-assisted Discharge Plasma) radiation source as is described, e.g., in WO 2005/025280 A2. The disk electrode 13 is preferably cooled by the metal coolant 3 which at the same time also supplies a coating as emitter material 14 for the EUV emission of the plasma 16 generated from it and as protection for the electrodes against erosion due to the electric discharge.

The immersion bath 25 receives the metal coolant 3 via the inlet 251 so that the disk electrode 13 is immersed therein. The outlet 252 is so arranged that the heated metal coolant 3 can flow off into the handling unit 26 automatically in line with the force of gravity, i.e., the handling unit 26 is arranged lower than the immersion bath 25 for this purpose.

The handling unit 26 is a receptacle that is divided into a plurality of chambers. A first, large chamber forms a reservoir 261 for the metal coolant 3. The metal coolant 3 can be received and stored in the reservoir 261 similar to the large volume 253 in the example according to FIG. 2. The reservoir 261 is connected to the immersion bath via outlet 252 so that the metal coolant 3 heated by the disk electrode 13 first arrives in the reservoir 261, initially mixes with the metal coolant 3 located in the reservoir 261, and is accordingly at least pre-cooled. Depending on the filling level of the reservoir 261, large changes in temperature are attenuated in this way. By reason of the high thermal load, the vessel having the immersion bath 25 is formed of at least one refractory metal such as titanium, vanadium, molybdenum, tungsten or steel (particularly stainless steel), for example, and can be additionally surface-coated, preferably with titanium nitride (TiN).

The heater 27 which has already been mentioned in the preceding examples is arranged inside of the reservoir 261 so as to be immersed in the metal coolant 3 in order to convert the metal coolant 3 from solid to liquid state when the radiation source is put into operation.

Besides the reservoir 261, the handling unit 26 has a cooling channel 262 for the metal coolant 3. The volume of the cooling channel 262 is substantially smaller than that of the reservoir 261, and the cooling channel 262 passes into the inlet 251 to the immersion bath 25. The cooling channel 262 has a comparatively small, preferably rectangular cross section and has at least one chamber wall 263 that provides a large surface for heat transfer.

In direct proximity to the chamber wall 263 of the cooling channel 262, the handling unit 26 has a further chamber which is formed as second vessel 5 of the secondary cooling circuit. In this case, the chamber wall 263 in common with the cooling channel 262 forms the cooling section 21 to which a plurality of cooling nozzles N1, N2, N3, . . . (in this example, without limiting generality, three cooling nozzles N1-N3) of the atomizing arrangement 41 are again directed. The chamber wall 263 is kept as thin as possible with a thickness of about 1 to 3 mm so that a good heat transfer is realized.

Because of the narrow cross section and the large surface of the cooling channel 262, the operating temperature of the metal coolant 3 that is guided past in cooling section 21 can be influenced very quickly allowing a fast response to temperature fluctuation of the metal coolant 3.

The second vessel 5 is connected to the cooling unit 7 via run-off 51. The used cooling liquid 4 is sucked out of the second vessel 5 via run-off 51. On the other side, the cooling unit 7 is connected to the atomizing arrangement 41 in that the required atomization pressure for the cooling nozzles N1-N3 is provided via the return 52 which is outfitted with the pumping means.

A pipe having a pump unit 8 arranged outside of the handling unit 26 is provided between the cooling channel 262 and the reservoir 261, and the metal coolant 3 is pumped out of the reservoir 261 through the pump unit 8, the cooling channel 262 and the inlet 251 to the immersion bath 25. The pump unit 8 moves the metal coolant 3 through the cooling channel 262 at a variable flow rate so that the cooling performance can be deliberately influenced depending on the temperature determined in the primary cooling circuit by switching the controllable cooling nozzles N1-N3 on and off individually.

The metal coolant 3 supplied to the immersion bath 25 is accelerated through the rotation of the disk electrode 13 so that, in addition to the flow generated by the pump unit 8, the disk electrode 13 also assists in circulating the metal coolant 3 located in the immersion bath 25.

The required cooling output is determined by temperature measurements, in this example preferably upstream and downstream of the cooling section 21, respectively. As in the previous examples, the first temperature sensor T1 is arranged at the inlet 251 to the immersion bath 25, the pipe downstream of cooling channel 262 affording sufficient space for this purpose. The temperature sensor T1 monitors the minimum operating temperature (e.g., 10-50 K above the melting point) of the metal coolant 3. The second temperature sensor T2 is arranged upstream of the cooling section 21, possibly also upstream of the pump unit 8 in the primary cooling circuit. In this way, monitoring can be carried out additionally to ensure that the metal coolant 3 is always supplied to the pump unit 8 approximately at the specified minimum operating temperature. Since the reservoir 261 is arranged upstream of the cooling channel 262, a sudden rise in temperature in the cooling channel 262 can be ruled out. Therefore, the evaluation of the temperature difference between temperature sensor T1 and temperature sensor T2 is not necessary but may possibly be useful for assessing the effectiveness of the cooling along cooling section 21.

Figure 4:
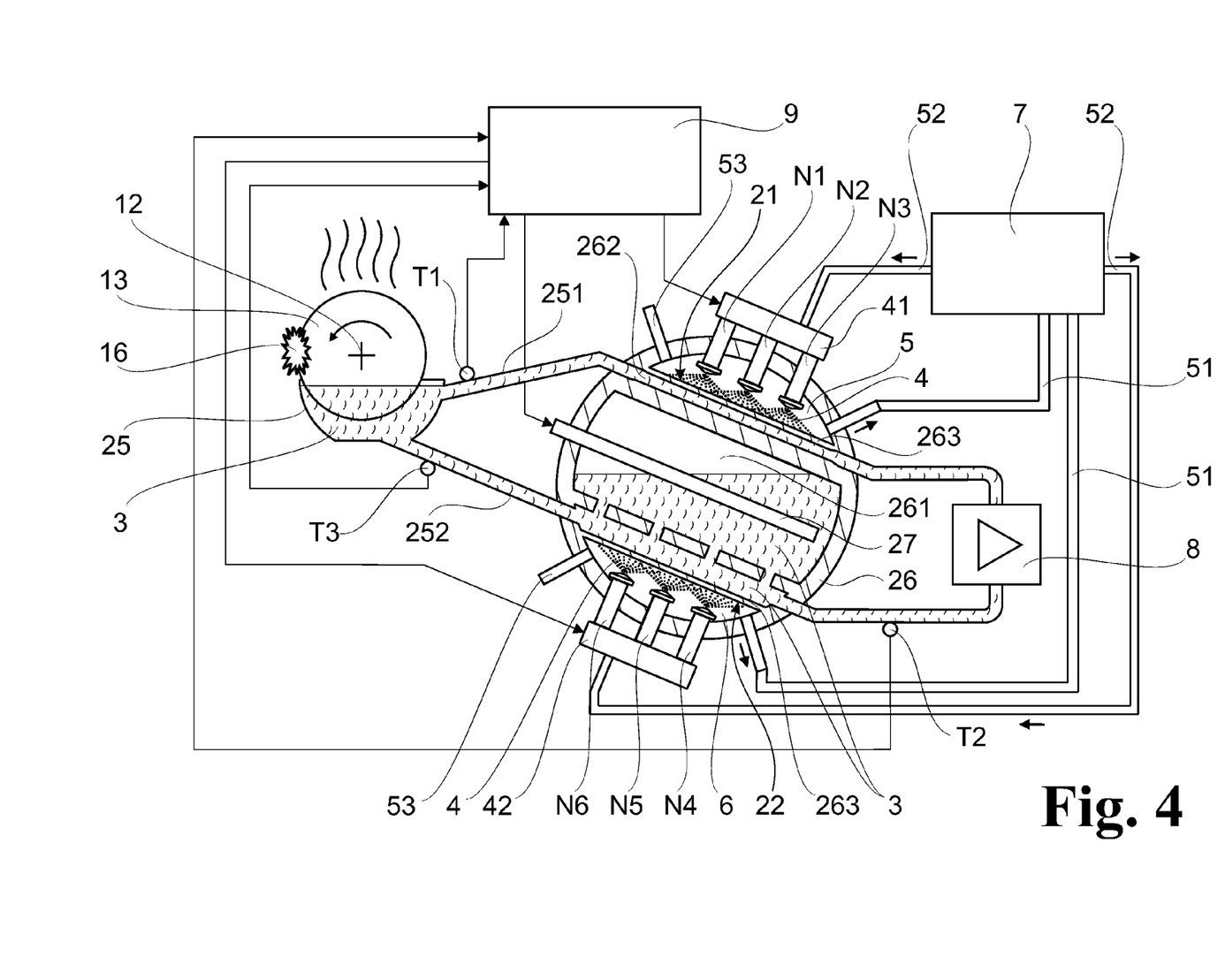
FIG. 4 an embodiment of the arrangement modified from that shown in FIG. 3 with two different cooling sections of spray cooling.

A further improvement in cooling performance can be achieved with the construction shown in FIG. 4. In addition to the construction described in the preceding embodiment example with the rapidly cooling cooling channel 262, the handling unit 26 in this case has a further chamber which likewise shares a chamber wall 263 with the reservoir 261 and is accordingly in thermal contact with the metal coolant 3 received in the reservoir 261. In contrast to the embodiment in FIG. 3, this chamber wall 263 which is preferably arranged below the reservoir 261 forms the further cooling section 22. Similar to the cooling section 21 at cooling channel 262, the further atomizing arrangement 42 is directed to the further cooling section 22. Accordingly, the large volume 253 of the metal coolant 3 in the reservoir 261 is cooled by the further cooling section 22 so that the cooling takes place substantially more slowly in this case in contrast to cooling channel 262. By means of the cooling of the reservoir 261, the buffering effect of the large volume 253 of the metal coolant 3 received in the reservoir 261 relative to the heated metal coolant 3 coming from the immersion bath 25 is maintained during high heat injection and a pre-cooling is achieved.

The second temperature sensor T2 and the third temperature sensor T3 are associated with the further cooling section 22 for determining the cooling output. The third temperature sensor T3 is arranged between immersion bath 25 and reservoir 261. Monitoring is carried out at both temperature sensors T2, T3 to ensure that the minimum operating temperature of the primary cooling circuit is maintained. The individual cooling nozzles N4-N6 are controlled, i.e., switched on or off, individually as needed in accordance with the minimum operating temperature, particularly during extended power output of the radiation source during plasma generation at the disk electrodes 13.

Referring to the arrangements already described, the method for cooling a plasma-based radiation source will be described more fully with reference to FIG. 1.

In the method, the temperature of a revolving element 1 taking part in a plasma generation in a plasma-based radiation source is corrected by means of a metal coolant 3 in that the revolving element 1 is at least partially immersed in the metal coolant 3 located in a first vessel 2 and is moved, preferably rotated, therein.

To this end, in a first method step, a metal (preferably tin, lithium, gadolinium, terbium) is converted as metal coolant 3 into a liquid aggregate state by heating (i.e., melting) it to a temperature above the melting point. This temperature is the minimum operating temperature of the metal coolant 3 that is at least maintained during the entire process so that the metal coolant 3 can never solidify during operation of the radiation source.

When the metal coolant 3 is completely liquefied, the plasma-based radiation source can be put into operation. To this end, in a second method step, the revolving element 1 taking part in the generation of a plasma 16 emitting short-wavelength radiation is set in rotation. In the immersed condition, a peripheral area of the revolving element 1 moves through the metal coolant 3 such that the metal coolant 3 coming in contact with the revolving element 1 is moved along with it in direction of rotation by the revolving element 1. The movement is transmitted to the metal coolant 3 in its entirety through the continuous rotation of the revolving element 1. This causes a primary cooling circuit to be formed in the first vessel 2 which contains the metal coolant 3 in that a continuous circulation of the metal coolant 3 takes place.

In the area in which it is immersed in the metal coolant 3, the revolving element 1 which is heated during operation of the radiation source due to the plasma generation provides for a local injection of heat. Depending on the intensity and duration of the plasma generation, the injection of heat can vary sharply within short intervals of time. The inherent efficiency of the radiation source of about 0.1% can require an input power, for example, of 15 kW to achieve a radiation power of about 10-15 W during the plasma generation. Therefore, during the period of the plasma generation for the exposure of substrates, an enormous amount of waste heat occurs which must be removed through the primary cooling circuit. Because of the high efficiency of the spray cooling which is used, the cooling output must be substantially throttled in the pauses between discharges occurring during the operation of the radiation source, e.g., a pause of about 20 s when changing from one substrate exposed for a period of about 40 s to the next substrate to be exposed, in order to prevent solidification of the metal coolant 3.

The primary cooling circuit ensures that the metal coolant 3 heated during the large injection of heat is removed from the revolving element 1 and fresh, cool metal coolant 3 is constantly supplied anew to the revolving element 1.

The cooling of the metal coolant 3 in the primary cooling circuit is effected by spray cooling directed to wall regions 231, 232, 233, . . . of the first vessel 2 in the cooling section 21 provided for this purpose. Spray cooling is activated only at temperatures above the minimum operating temperature of the metal coolant 3.

During the operation of the radiation source, pauses also occur in the plasma generation. There is no further injection of heat into the metal coolant 3 by the revolving element 1 during the pauses. In order that the operating temperature is always kept above the melting point, the spray cooling is switched off during the pauses so that there is no risk of solidification. If the temperature drops below the minimum operating temperature, the metal coolant 3 is additionally heated (as is also the case before the radiation source is put into operation).

The spray cooling is operated parallel to the primary cooling circuit in a secondary cooling circuit and has a plurality of individually controllable cooling nozzles N1, N2, N3, . . . . By switching individual cooling nozzles N1, N2, N3, . . . on and off, the spray cooling can be adjusted such that the cooling output delivered by it is metered (in stages of one switched-on or switched-off cooling nozzle N(i) in each instance, where i=1, . . . n, and n is the quantity of nozzles provided). The adjustment of the cooling output is carried out depending on the measured temperature of the metal coolant 3. The temperature is measured continuously, at least directly upstream of the revolving element 1, and is compared with the minimum operating temperature of the metal coolant 3.

Cooling nozzle N1 of the spray cooling arrangement is switched on as soon as the temperature determined upstream of the revolving element 1 exceeds the desired minimum operating temperature. Cooling nozzle N2 is not switched on until the operating temperature has risen to values of about 20-30 Kelvin above the minimum operating temperature. The greater the difference in temperature between the measured temperature and the minimum operating temperature, the higher the setting of the activated cooling output of the spray cooling arrangement by individually switching on further cooling nozzles N2, N3, . . . ; the smaller the temperature difference, the more the cooling output is reduced by switching off individual cooling nozzles N1, N2, . . . until the spray cooling is completely turned off. The switching on of the cooling nozzles N2, N3, ... takes place progressively so as to counter rapid rises in temperature with increasing cooling output.

The cooling nozzles N1, N2, N3, ... are associated in each instance with one of the separate wall regions 231, 232, 233, ... within the cooling section 21 of the first vessel 2 so that each cooling nozzle N1, N2, N3, ... can also contribute separately to the cooling output. However, given a large number of cooling nozzles N1, N2, N3, ..., a slight overlapping of the sprayed wall regions 231, 232, 233, ... can also be permissible.

Aside from the sharply varying injection of heat by the revolving element 1, a change in temperature also depends on a total volume of metal coolant 3 in the primary cooling circuit. The greater the total volume, the more the temperature changes will be attenuated by a mixing of the locally heated metal coolant 3 with the rest of the metal coolant 3 which takes place during circulation.

In addition to merely monitoring the operating temperature of the metal coolant 3 upstream of the revolving element 1, the cooling output can also be adapted in an advantageous manner by taking temperature differences between different temperature measurement points.

If the temperature measurement is carried out upstream and downstream of the revolving element 1, the heat injected directly by the revolving element 1 can be determined as a rise in temperature. The cooling output of the spray cooling arrangement is then controlled corresponding to the determined temperature difference as well as the temperature measurement upstream of the revolving element 1. If a large temperature difference is determined, more than one cooling nozzle N1, N2, N3, ... is switched on simultaneously to bring about a more rapid cooling. If the temperature difference is slight, the cooling nozzles N1, N2, N3, ... are controlled in the same way as before based on the temperature measurement upstream of the revolving element 1. By measuring the temperature directly upstream and downstream of the revolving element 1, sharp fluctuations in heat injection can be reacted to very quickly.

Further, the temperature difference can also be determined via the cooling section 21 by carrying out the temperature measurement upstream and downstream of the cooling section 21. The temperature difference determined in this way expresses the cooling performance (heat removal) achieved in this cooling section 21. The cooling performance is initially controlled as a function of the temperature determined downstream of the cooling section 21. The first cooling nozzle N1 of the spray cooling arrangement is switched on when the temperature determined downstream of the cooling section 21 rises above the minimum operating temperature. The cooling output is increased or reduced by switching on or switching off further cooling nozzles N2, N3, ... when the determined temperature downstream of the cooling section 21 continues to rise. In addition, the temperature difference is evaluated. If this temperature difference exceeds a fixed threshold value, the cooling output can be adapted more quickly to a rapidly changing temperature by switching on and switching off more than one cooling nozzle N1, N2, N3, ... simultaneously.

To further increase the cooling output and to achieve an even more differentiated adaptation of the operating temperature of the metal coolant 3, a plurality of cooling sections 21, 22 can be provided at the first vessel 2. Each of these cooling sections 21, 22 has a plurality of cooling nozzles N1, N2, ... and N4, N5, ..., respectively, which are associated in the respective cooling section 21, 22 with a separate wall region 231, 232, ... of the first vessel 2 in each instance.

Determination of the temperature or temperature difference is carried out separately for each cooling section 21, 22 by measuring the temperature upstream and downstream of the respective cooling section 21, 22. The cooling output is then adapted in a manner analogous to the method described in the preceding paragraph.

LIST OF REFERENCE NUMERALS 1 revolving element
11 (rotating) disk
12 axis of rotation
13 (rotating) disk electrode
14 emitter material
15 laser
16 plasma
2 first vessel
21 cooling section
22 further cooling section
23 vessel wall
231, ..., 236 wall region
24 intermediate wall
25 immersion bath
251 inlet
252 outlet
253 large volume
26 handling unit
261 reservoir
262 cooling channel
263 chamber wall
27 heater
3 metal coolant
4 cooling liquid
41 atomizing arrangement
42 further atomizing arrangement
5 second vessel
51 run-off
52 return
53 air entry
6 third vessel
7 cooling unit
8 pump unit
9 control unit
N1, N2, N3, ... (first, second, third, ... ) cooling nozzle
T1, T2, T3, ... (first, second, third, ... ) temperature sensor

What is claimed is:

1. An arrangement for cooling a plasma-based radiation source having a revolving element, the arrangement comprising:
   a primary cooling circuit comprising a first vessel for holding a metal coolant in which the revolving element is at least partially immersed;
   means for circulating the metal coolant in the first vessel;
   means for maintaining a temperature of the metal coolant to a predetermined operating temperature above a melting point of the metal coolant;
   a secondary cooling circuit comprising:
      a cooling liquid that evaporates at the operating temperature of the metal coolant;
      a second vessel enclosing at least one cooling section of the first vessel;
      at least one atomizing arrangement for the cooling liquid to spray defined wall regions of the at least one cooling section with the cooling liquid depending on a temperature determined for the metal coolant;
      a cooling unit for sucking evaporated cooling liquid out of the second vessel, for condensing and for returning the cooling liquid under pressure to the at least one atomizing arrangement; and a control unit for controlling the means for maintaining the temperature of the metal coolant, the control unit being configured for differentiated cooling by controlling the at least one atomizing arrangement depending on the predetermined temperature of the metal coolant and for selectively heating the metal coolant by controlling a heater when the determined temperature falls below a minimum operating temperature of the metal coolant.

2. The arrangement according to claim 1, wherein the at least one atomizing arrangement comprises a plurality of cooling nozzles (N1, N2, . . . ), each cooling nozzle being directed to one of the defined wall regions and capable of being switched on and off individually depending on the predetermined temperature of the metal coolant, and wherein the control unit being configured to control the cooling nozzles (N1, N2, . . . ) individually depending on the predetermined temperature of the metal coolant.

3. The arrangement according to claim 1, further comprising at least one temperature sensor (T1) disposed at a wall of the first vessel at which heat introduced by the revolving element and transferred via the metal coolant is perceived first.

4. The arrangement according to claim 3, wherein the first temperature sensor (T1) is disposed downstream of a region of the first vessel in which the revolving element is immersed, and wherein a second temperature sensor (T2) is disposed upstream of the region to measure a temperature difference caused by heat injected by the revolving element.

5. The arrangement according to claim 3, wherein the first temperature sensor (T1) is disposed upstream of the at least one cooling section of the first vessel and wherein a second temperature sensor (T2) is disposed downstream of the at least one cooling section to measure a temperature difference caused by heat removal carried out via the at least one cooling section.

6. The arrangement according to claim 1, wherein the defined wall regions of one cooling section are disposed upstream of a supply of the metal coolant to the revolving element in the primary cooling circuit.

7. The arrangement according to claim 1, wherein defined wall regions of two separated cooling sections of the first vessel are enclosed either by the second vessel or by a third vessel, and wherein each of the at least two cooling sections comprise an atomizing arrangement for the cooling liquid, wherein one of the two separated cooling sections is disposed upstream of a supply of the metal coolant to the revolving element in the primary cooling circuit and wherein another of the two separated cooling sections is located downstream of a removal of the metal coolant from the revolving element in the primary cooling circuit.

8. The arrangement according to claim 6, further comprising a temperature sensor (T1) associated with the at least one cooling section at the primary cooling circuit for determining a temperature upstream and a temperature sensor (T2) for determining a temperature downstream of the at least one cooling section.

9. The arrangement according to claim 7, further comprising a temperature sensor (T1) associated with each cooling section of the two separated cooling sections at the primary cooling circuit for determining a temperature upstream of its respective cooling section, and further comprising a temperature sensor (T2) for determining a temperature downstream of said each cooling section.

10. The arrangement according to claim 7, wherein one of the cooling sections at the primary cooling circuit is disposed upstream of the supply of the metal coolant to the revolving element and wherein the other cooling section at the primary cooling circuit is disposed downstream of the removal of the metal coolant from the revolving element.

11. The arrangement according to claim 10, wherein one of the cooling sections is disposed in a region of a reservoir of the metal coolant and the other of the cooling sections is disposed in a region of the immersed revolving element.

12. The arrangement according to claim 10, wherein one cooling section at one wall region of the first vessel is disposed at a supply channel to a region in which the revolving element is immersed in the metal coolant, and the other of the cooling sections is disposed at a further wall region of the first vessel at a reservoir of the metal coolant downstream of a return channel from the region of the immersed revolving element.

13. A method for cooling a plasma-based radiation source having a revolving element, comprising the steps of:

providing a metal coolant in a first vessel to partially immerse the revolving element of the radiation source to be cooled;

heating the metal coolant to an operating temperature above its melting point;

circulating the metal coolant and forming a primary cooling circuit for supplying the metal coolant to the revolving element; and cooling the primary cooling circuit with a cooling liquid in a secondary cooling circuit by spray cooling, wherein a cooling output is controlled as a function of a measured temperature of the metal coolant.

14. The method according to claim 13, further comprising:

determining a temperature of the metal coolant upstream and downstream of the revolving element and calculating a temperature difference for a heat injection caused by the revolving element;

controlling the cooling output of the spray cooling depending on the calculated temperature difference for the heat injection; and cooling the metal coolant by selectively switching on and off a plurality of cooling nozzles (N1, N2, N3, . . . ) serving to respectively spray the cooling liquid on wall regions of a cooling section of the first vessel containing the metal coolant.

15. The method according to claim 13, further comprising:

determining a temperature of the metal coolant upstream and downstream of a cooling section of the first vessel of the primary cooling circuit and calculating a temperature difference for a heat removal achieved over a length of the cooling section;

controlling the cooling efficiency of the spray cooling as a function of the calculated temperature difference for the achieved heat removal; and cooling the metal coolant in an adjusted manner by selectively switching on and off a plurality of cooling nozzles (N1, N2, N3, . . . ) serving to respectively spray the cooling liquid on wall regions of a cooling section of the first vessel containing the metal coolant.

16. The method according to claim 15, further comprising:

cooling the metal coolant in at least two cooling sections by selectively switching on and off the plurality of cooling nozzles (N1, N2, N3, . . . ) which are operated in regions with different temperature fluctuations of the metal coolant;

determining respective temperature differences for the achieved heat removal by means of the at least two cooling sections of the first vessel; and controlling in an adjusted manner by cooling in the at least two cooling sections as a function of a respective calculated temperature difference for the achieved heat removal.

* * * * *